(12) United States Patent
Maus et al.

(10) Patent No.: US 10,580,912 B2
(45) Date of Patent: Mar. 3, 2020

(54) ARRANGEMENT WITH A COMPONENT ON A CARRIER SUBSTRATE, AN ARRANGEMENT AND A SEMI-FINISHED PRODUCT

(71) Applicant: MSG LITHOGLAS AG, Berlin (DE)

(72) Inventors: Simon Maus, Berlin (DE); Ulli Hansen, Berlin (DE)

(73) Assignee: MSG LITHOGLAS AG, Berlin (DE)

( * ) Notice: Subject to any disclaimer, the term of this patent is extended or adjusted under 35 U.S.C. 154(b) by 0 days.

(21) Appl. No.: 14/635,200

(22) Filed: Mar. 2, 2015

(65) Prior Publication Data

US 2015/0179828 A1 Jun. 25, 2015

Related U.S. Application Data

(62) Division of application No. 13/497,585, filed as application No. PCT/DE2010/075096 on Sep. 24, 2010, now Pat. No. 8,966,748.

(30) Foreign Application Priority Data

Sep. 24, 2009 (DE) .......................... 10 2009 042 479

(51) Int. Cl.
  *H01L 23/48* (2006.01)
  *H01L 31/0232* (2014.01)
  (Continued)

(52) U.S. Cl.
  CPC .......... *H01L 31/0232* (2013.01); *H01L 24/97* (2013.01); *H01L 31/0203* (2013.01);
  (Continued)

(58) Field of Classification Search
  CPC ..... H01L 24/97; H01L 31/0232; H01L 33/48; H01L 2924/161
  (Continued)

(56) References Cited

U.S. PATENT DOCUMENTS 4,826,272 A 5/1989 Pimpinella et al.
5,068,713 A * 11/1991 Toda ..................... H01L 25/042
                                                             257/680

(Continued)

FOREIGN PATENT DOCUMENTS

DE    199 63 550           7/2001
JP    2008252127 A         10/2008
  (Continued)

OTHER PUBLICATIONS

International Preliminary Report on Patentability and Written Opinion dated Apr. 3, 2012; PCT/DE2010/075096; Leib et al., 5 pages.

(Continued)

*Primary Examiner* — Nitin Parekh

(74) *Attorney, Agent, or Firm* — Schmeiser, Olsen & Watts, LLP

(57) ABSTRACT

An arrangement including a carrier substrate, and a component situated on a cover surface of the carrier substrate in a hollow space, and electrical contacts for the component, wherein the hollow space is comprised of a plurality of spacer elements arranged on the cover surface of the carrier substrate and a cover substrate mounted on the plurality of spacer elements is provided. A semi-finished product comprising a carrier substrate made of silicon, wherein one or more recesses are formed on one side of the carrier substrate, and wherein the semi-finished product further comprises an alkaline evaporated glass applied to the side of the carrier substrate having the one or more recesses is also provided.

21 Claims, 5 Drawing Sheets

(51) Int. Cl.
  *H01L 33/00* (2010.01)
  *H01L 33/60* (2010.01)
  *H01L 33/48* (2010.01)
  *H01L 23/00* (2006.01)
  *H01L 31/0203* (2014.01)
  *H01L 31/02* (2006.01)
  *H01L 33/58* (2010.01)
  *H01L 33/52* (2010.01)

(52) U.S. Cl.
  CPC ...... *H01L 31/02005* (2013.01); *H01L 33/005* (2013.01); *H01L 33/48* (2013.01); *H01L 33/60* (2013.01); *H01L 33/52* (2013.01); *H01L 33/58* (2013.01); *H01L 2224/48091* (2013.01); *H01L 2224/48227* (2013.01); *H01L 2924/01068* (2013.01); *H01L 2924/01322* (2013.01); *H01L 2924/09701* (2013.01); *H01L 2924/1815* (2013.01); *Y10T 29/49002* (2015.01); *Y10T 29/4913* (2015.01); *Y10T 29/49128* (2015.01); *Y10T 29/49146* (2015.01); *Y10T 29/49155* (2015.01); *Y10T 29/49169* (2015.01)

(58) Field of Classification Search
  USPC .................................................. 257/704, 680
  See application file for complete search history.

(56) References Cited

U.S. PATENT DOCUMENTS

| | | | |
|---|---|---|---|
| 5,293,511 A * | 3/1994 | Poradish | G02B 26/0833 257/432 |
| 5,323,051 A | 6/1994 | Adams et al. | |
| 5,467,252 A * | 11/1995 | Nomi | H01L 23/3128 174/261 |
| 5,607,160 A | 2/1997 | Warfield | |
| 5,915,168 A | 6/1999 | Salatino | |
| 5,976,952 A * | 11/1999 | Gardner | H01L 21/76213 257/E21.556 |
| 5,981,945 A | 11/1999 | Spaeth et al. | |
| 6,031,292 A * | 2/2000 | Murakami | H01L 21/486 257/737 |
| 6,106,735 A | 8/2000 | Kurle et al. | |
| 6,117,705 A * | 9/2000 | Glenn | G11C 16/18 257/E23.181 |
| 6,143,588 A * | 11/2000 | Glenn | H01L 31/0203 257/434 |
| 6,228,675 B1 | 5/2001 | Ruby et al. | |
| 6,303,983 B1 | 10/2001 | Shook | |
| 6,429,511 B2 | 8/2002 | Ruby et al. | |
| 6,566,745 B1 * | 5/2003 | Beyne | H01L 27/14618 257/431 |
| 6,759,723 B2 | 7/2004 | Silverbrook | |
| 6,787,897 B2 | 9/2004 | Geefay et al. | |
| 6,876,008 B2 | 4/2005 | Bhat et al. | |
| 6,900,509 B2 | 5/2005 | Gallup et al. | |
| 6,932,519 B2 | 8/2005 | Steinberg et al. | |
| 6,967,354 B2 | 11/2005 | Silverbrook | |
| 6,969,639 B2 | 11/2005 | Cho et al. | |
| 6,982,437 B2 | 1/2006 | Gallup et al. | |
| 6,998,691 B2 | 2/2006 | Baugh et al. | |
| 7,268,436 B2 | 9/2007 | Aigner et al. | |
| 8,003,998 B2 | 8/2011 | Bogner et al. | |
| 2002/0018911 A1 | 2/2002 | Bernius et al. | |
| 2004/0077121 A1 | 4/2004 | Maeda et al. | |
| 2006/0026703 A1 | 11/2006 | Lim et al. | |
| 2007/0148807 A1 | 6/2007 | Akram | |
| 2007/0187789 A1 | 8/2007 | Kathman et al. | |
| 2007/0190691 A1 | 8/2007 | Humpston et al. | |
| 2008/0179613 A1 | 7/2008 | Wendt et al. | |
| 2009/0001405 A1 | 1/2009 | Seok | |
| 2009/0273047 A1 | 11/2009 | Yamamoto | |
| 2010/0102437 A1 | 4/2010 | Suto | |
| 2010/0108133 A1 * | 5/2010 | Bhagavatula | H01L 31/0392 136/256 |
| 2010/0230697 A1 | 9/2010 | Kohler et al. | |
| 2010/0244067 A1 | 9/2010 | Winkler | |
| 2011/0198743 A1 * | 8/2011 | Nikitin | H01L 23/492 257/690 |

FOREIGN PATENT DOCUMENTS

| | | |
|---|---|---|
| JP | 2008546197 A | 12/2008 |
| JP | 2009267049 A | 11/2009 |
| WO | 2004/068665 | 8/2004 |

OTHER PUBLICATIONS

International Search Report for international application No. PCT/DE2010/075096, dated Feb. 4, 2011. 3 pages.
U.S. Appl. No. 13/497,585, filed Mar. 22, 2012.
Notice of Allowance for U.S. Appl. No. 13/497,585, dated Oct. 27, 2014.
Office Action for U.S. Appl. No. 13/497,585, dated Apr. 3, 2014.

* cited by examiner

ARRANGEMENT WITH A COMPONENT ON A CARRIER SUBSTRATE, AN ARRANGEMENT AND A SEMI-FINISHED PRODUCT

CROSS-REFERENCE TO RELATED APPLICATIONS

This application is a divisional application of U.S. application Ser. No. 13/497,585, filed Mar. 22, 2012, and entitled "Method For Manufacturing An Arrangement With A Component On A Carrier Substrate, An Arrangement And Method For Manufacturing A Semi-Finished Product, and A Semi Finished Product," which claims priority to PCT/DE2010/075096, filed Sep. 24, 2010, and DE 10 2009 042 479.2, filed Sep. 24, 2009.

FIELD OF TECHNOLOGY

The invention relates to a method for manufacturing an arrangement with a component on a carrier substrate, an arrangement and method for manufacturing a semi-finished product, and a semi-finished product.

BACKGROUND

Known in the art in particular in conjunction with electronic components are arrangements in which the electronic component is applied to a carrier substrate, for example a semiconductor material. Various proposals have been made for arrangements in which the component is arranged in a hollow space, which is also referred to as encapsulation or capsulation.

Known from document U.S. Pat. No. 6,932,519 B2 is an arrangement in which an optical component is arranged in a recess or cavity on the carrier substrate. Spacer elements arranged laterally from the recess on the cover surface of the carrier substrate are used to space a cover substrate apart from the carrier substrate to form the hollow space. The recess in the carrier substrate is formed with slanted or inclined edge surfaces.

Document U.S. Pat. No. 6,969,639 B2 discloses an arrangement in which an electronic component is arranged on the cover surface of the carrier substrate and in a hollow space formed by means of spacer elements and a cover substrate. Electrical contacts for the electronic component are routed out of the hollow space.

Known from document DE 10 2007 039 291 A1 are an optoelectronic semiconductor module and a method for manufacturing the latter. The optoelectronic semiconductor module has a chip carrier, a light-emitting semiconductor chip mounted on the chip carrier, and a cover element that is arranged on the side of the semiconductor chip facing away from the chip carrier and exhibits a frame section, wherein the frame section laterally envelops the semiconductor. The frame section is connected with the cover plate without a joining adhesive layer, and connected with the chip carrier on its side remote from the cover plate. The frame section forms spacers that border hollow spaces for accommodating components. The frame section is fabricated by providing a so-called frame wafer with a unilaterally structured mask layer. Openings are then produced therein by etching through the frame wafer. The mask layer is subsequently removed, and the frame section is applied to a cover plate wafer, thereby creating hollow spaces for accommodating components.

The known method has disadvantages when given the objective of manufacturing thin spacers or large quantities. The thin frame wafers required by the known method are fragile, and run a high risk of breaking while being applied to the cover plate wafer. In addition, the frame wafers exhibit continuous openings, which preclude any automatic handling with vacuum handlers commonly encountered in the industry. While this problem can be circumvented by means of temporarily bonded carrier wafers for some applications, doing so results in additional material usage and additional procedural steps, and hence in elevated costs.

Document DE 10 2004 025 735 A1 discloses a housing for an optical receiver, in which the receiver is arranged in a hollow space.

Document DE 10 2004 025 775 A1 discloses surface emission laser housings, which exhibit an integrated optical element and an integrated alignment post.

Document EP 1 729 350 A2 discloses a so-called LED package.

Document US 2002/0018911 A1 also relates to an optoelectronic element, in which components are capsulated.

Document EP 0 305 112 B1 describes a device for coupling an optical filter to an optoelectronic device.

Document DE 199 63 550 A1 discloses a bipolar lighting source comprised of a unilaterally contacted, self-bundling semiconductor body.

Document E 10 2004 045 947 A1 describes a light-emitting diode arrangement in which the light-emitting diode is arranged in a hollow space.

Document EP 0 731 509 A1 discloses an optoelectronic transducer as well as a manufacturing method, in which spacers carrying a lens system are arranged on a floor plate.

Document US 2009/0001405 A1 also relates to a light-emitting component, in which a frame section forms receiving spaces for components.

SUMMARY

It is an object of the invention to provide improved technologies for an arrangement with a component on a carrier substrate, in particular an electronic component, which optimizes the possible applications in conjunction with capsulated components, and enables a cost-effective production with high yields. The capsulation is preferably hermetically or quasi-hermetically sealed, in particular with respect to ambient humidity.

This object is achieved in the invention with a method for manufacturing an arrangement with a component on a carrier substrate according to independent claim 1, as well as with an arrangement according to independent claim 13. Also provided is a method for manufacturing a semi-finished product for a component arrangement with a capsulated component according to claim 15 as well as a semi-finished product for a component arrangement according to independent claim 16. Advantageous embodiments of the invention are the subject of dependent subclaims.

One aspect of the invention provides a method for manufacturing an arrangement with a component on a carrier substrate, in which spacer elements are fabricated on the rear side of a cover substrate. The method comprises steps of: providing a substrate, fabricating one or more recesses (cavities) in the region of a selected substrate surface, situating the cover substrate on the selected substrate surface so as to form at least one recessed hollow space, and thinning back the substrate from a substrate surface opposed to the selected surface so as to open the at least one recessed hollow space, and thereby form separate spacer elements that together with the cover substrate border at least one hollow space that is open in the region of the opposing substrate surface. It is then further provided that a component be arranged on a cover surface of a carrier substrate, and that the spacer elements formed on the cover substrate be arranged on the carrier substrate so as to situate the component in the at least one hollow space and close the latter.

A further aspect of the invention provides an arrangement that is manufactured according to the preceding method and comprises the following features: a carrier substrate, a capsulated component situated on a cover surface of the carrier substrate in a hollow space, and electrical contacts for the component, wherein the hollow space is comprised of spacer elements arranged on the cover surface of the carrier substrate and a cover substrate mounted on the spacer elements, and wherein the spacer elements exhibit a height of about 10 µm to about 300 µm, preferably a height of about 30 µm to about 300 µm, and further preferred a height of about 30 µm to about 100 µm. It was surprisingly found that the method described above enables the reliable and reproducible manufacture of spacer elements with such comparatively low design heights.

Another aspect of the invention provides a method for manufacturing a semi-finished product for a component arrangement, in particular for a component arrangement with a capsulated component, wherein the method comprises steps of: providing a cover substrate and fabricating spacer elements and a receiving space formed between the spacer elements on a rear side of the cover substrate, wherein the receiving space is configured for the capsulated reception of at least one component while arranging the cover substrate on a carrier substrate. Manufacturing the spacer elements encompasses the following steps: providing a substrate, fabricating one or more recesses (cavities) in the region of a selected substrate surface, arranging the cover substrate on the selected substrate surface so as to form at least one recessed hollow space, and thinning back the substrate from a substrate surface opposed to the selected surface so as to open the at least one recessed hollow space, and thereby form separate spacer elements that together with the cover substrate border the receiving space that is open in the region of the opposing substrate surface.

An aspect of the invention further provides a semi-finished product for a component arrangement manufactured according the aforementioned method, in which spacer elements structured on the rear side are formed on a cover substrate, and at least one recessed hollow space is formed between the structured spacer elements, which is configured for receiving a component, wherein the spacer elements exhibit a height of about 10 µm to about 300 µm, preferably a height of about 30 µm to about 300 µm, and further preferred a height of about 30 µm to about 100 µm.

The proposed method provides the opportunity to manufacture spacer elements in a structured form (structured spacer elements) on the rear side of the cover substrate, initially independently of the carrier substrate and component arranged hereupon, which in particular involves an electrical or electronic component, so as to then fabricate an arrangement using the two semi-finished products, specifically the carrier substrate with component arranged hereupon on the one hand and the cover substrate with the spacer elements formed on the rear side on the other. As a consequence, the spacer elements can be formed on the rear side of the cover substrate without regard for any potential influences these manufacturing steps might have on the carrier substrate or the component, since only the cover substrate and spacer elements are processed. Similarly, the components are arranged on the cover surface of the carrier substrate independently of the spacer elements. Thinning back makes it possible in particular to manufacture the spacer elements with a desired height. Depending on the situation, a height reflecting the applications requirements can be created, in particular to also form spacers with diminished design heights compared to known arrangements.

An advantageous embodiment of the invention can provide that arranging the spacer element formed on the cover substrate encompass a step for generating another hollow space/receiving space with another component. The explanations given above and below in conjunction with the hollow space apply accordingly with respect to the additional hollow space/receiving space.

For example, the substrate involves a semiconductor substrate, e.g., Si, in which the one or more recesses are fabricated, for example via dry or wet etching. It can be provided that any formed metal coatings or dielectric layers be fabricated already before or after the cover substrate is arranged on the substrate surface. In this or other embodiments, the metal coatings can consist of aluminum (favorably as a reflector in a wide spectral range including UV) or silver (favorably as a reflector in the visible spectral range). One embodiment involves adhesively bonding the cover substrate, e.g. which can be an unstructured glass wafer. Thinning back the substrate is accomplished via etching and/or machining, for example.

The bonding of the substrate and cover substrate before back thinning occurs via adhesive bonding (adhesive joining). In the case of a silicon spacer and cover substrate made out of alkaline glass, joining can also take place by way of an anodic bond. The boundary layer between the substrates is completely hermetic in an anodic bond; it is only quasi-hermetic in a normal adhesive bond. It can also be provided that a structured layer comprised of alkaline evaporated glass be applied to a cover substrate made of silicon, followed by the joining of the Si spacer element and cover substrate, once again by way of an anodic bond. The structured spacer element and cover substrate can be connected via a direct bond (joining of polished surfaces with each other, optionally with plasma pretreatment or thermal post-treatment).

The application of corresponding metal coatings onto the surface of the spacer element and cover substrate also enables joining at corresponding temperatures by means of a so-called eutectic bond, wherein copper and tin can be used as the metal coating partners, for example. A soldered bond can also be used. This involves a structured application of soldering paste or soldering glass, for example via screen printing, followed by remelting or fusing the solder.

Etching processes can be used for fabricating the spacer elements. Si can be wet etched in a 100-orientation using an aqueous KOH solution. This yields etching-bound planes along the 111-orientation with a typical angle of 54.7°. Given other surface orientations, different flank angles can be realized accordingly. Dry etching processes permit the manufacture and targeted adjustment of flank angles deviating from the latter. For example, it is possible to produce distinctly shallower angles, e.g., 30° to 45°, or steeper angles, e.g., 60° to 90°, depending on the application. Adjusted entry or exit angles can be preferred for specific applications. Nearly perpendicular walls can also be etched using dry etching processes (Bosch process). In like manner, dry etching processes enable a non-monotonous, constant progression, i.e., the formation of curved surfaces for the etching flanks. For example, this could find application in micro-parabolic reflectors.

A preferred further development of the invention provides that the one or more recesses are formed in a multistage process, in which another recess is optionally formed in an existing recess. In one configuration, a recess or cavity is effectively introduced in the recess. For example, the additional recess can be formed on the floor of the previously generated recess, resulting in a larger depth overall. The multistage process is performed in one embodiment by means of masking, which makes it possible to mask portions of a first recess once it has been formed, so as to generate the additional recess in the existing recess. Examples of possible masking technologies include the use of a (separate) metal mask, through which evaporating can take place, and/or the application of a photoresist mask on the substrate. It can also be provided that a multistage process be developed to generate recesses or cavities of varying scope in several sequential procedural steps as an alternative or supplement to manufacturing the additional recess in the existing recess. The shadow mask technology can also be used to this end, making it possible to shadow regions within the individual procedural steps.

An expedient embodiment of the invention can provide for the formation of several recesses that differ from each other with respect to one or more of the following recess parameters: Cross sectional size, cross sectional shape and height. This or other embodiments can provide that back thinning takes place in multiple stages, i.e., in several sequential procedural steps. In this conjunction, the shadow mask technology can be used in one embodiment during a back thinning step to shadow regions to be thinned in another procedural step or not at all.

An advantageous embodiment of the invention provides that, in the process of back thinning the substrate, one section of the substrate be thinned back to a greater extent than another section of the substrate. For example, this can be done by shadowing sections of the substrate, or through selective abrasive machining. The section thinned back to a greater extent can encompass several partial sections, which are formed coherently or individually.

A further development of the invention preferably provides that a contour of the spacer facing the hollow space be created by generating a partial contour both while forming the one or more recesses and thinning back the substrate. In this embodiment, the spacer contour is formed on the side facing the hollow space both while fabricating the recess and thinning back the substrate. In this way, any contour can be manufactured, for example those which can also encompass steps or transitions between straight and inclined wall sections.

A preferred further development of the invention provides that the process of manufacturing spacer elements encompass a step for generating an undercut on a side of the spacer elements facing the cover substrate. An expedient configuration of the invention can provide that the spacer elements be formed with one or more inclined surfaces. In one embodiment, an inclined surface is formed in the region of the undercut. The slanted or inclined surface that can be generated inside and/or outside on the structured spacer elements is fabricated so as to exhibit an inclination relative to the vertical axis of the arrangement geometry. In one configuration, the slant extends essentially over the entire height of the spacer elements, meaning from the carrier substrate up to the cover substrate. A continuous, uniform slant can here be generated. As an alternative, it can be provided that several mutually offset, slanted surface sections be fabricated, which in one configuration optionally exhibit differing inclinations. In one embodiment, a coating can be provided with one or more dielectric layers on the slanted surfaces, for example to realize a dielectric reflector through the application of dielectric layers with alternating fraction indices. For example, the dielectric layers can be applied with the help of plasma-enhanced electron beam evaporation. Alternatively or additionally, the slanted surface can be generated with a curved surface, wherein a convex or concave design can be used. A continuous curve can be formed over the inclined surface. As an alternative, the curve only extends over a partial region of the slanted lateral surface of the spacer element. Partial regions of an inclined lateral surface can also exhibit varying curves, which are characterized in particular by different angles of curvature. A configuration with curves can also be provided in conjunction with lateral surfaces of the spacer element that are not slanted.

An advantageous embodiment of the invention provides that the process of manufacturing spacer elements encompass a step for generating a coating on the spacer elements in the form of a metal coating and/or optically reflective surface. In an embodiment, the metal coating is formed on the surface sections of the spacer elements facing the hollow space. These surfaces can be completely or partially covered by the metal coating. In an embodiment, opposing sides or surfaces are metal coated. The metal coating can be microstructured.

A further development of the invention preferably provides that the process of manufacturing the spacer element encompass a step for generating an optically functional layer on the spacer elements. The term "optically functional" as intended here relates to influencing specific properties of electromagnetic radiation, in particular light. The optically functional layer can be used to create an optically reflective or antireflective surface, a dielectric reflector, an antireflection layer, a filter layer, an absorber layer, a diffractive optical element and/or a lattice structure. For example, an optically reflective surface can be used to increase the light reflection on the reflective surfaces. In one embodiment, the metal coating is part of the reflective surface. It can also be provided that the reflective surface be fabricated exclusively with the help of the metal coating. The optically reflective surface is preferably formed on inside surfaces of the structured spacer elements, i.e., in surface regions facing the hollow space. This or other surface regions can be partially or completely provided with the optically reflective surface.

A preferred further development of the invention provides that one or more connectors be fabricated for electrically contacting the component. Electrical contacts for the component, which is preferably an electrical or electronic component, can be manufactured by running electrical connections between the hollow space and exterior through a region between the spacer elements and carrier substrate. In another embodiment, electrical contacting involves setting up so-called vias through the carrier substrate, so that an electrical connection can be established on the rear side of the carrier substrate, i.e., on the side facing away from the hollow space. For example, soldering contacts can then be fabricated there for component assembly. Conductor paths could also be routed upward over the slanted surface so as to provide electrical contacts for the component enclosed in the hollow space.

An expedient configuration of the invention can provide that the spacer elements arranged on the cover substrate be situated on the cover surface of the carrier substrate as a wafer-level encapsulation. In this configuration, the component is arranged on a wafer, and subsequently capsulated with the non-singulated, semi-finished product with one or more structured spacer elements and cover substrate, i.e., situated in the hollow space. It can also be provided that the semi-finished product comprised of the structured spacer element and cover substrate be directly bonded on a non-singulated device wafer (wafer-level-capping). In this embodiment, the one or several components to be capsulated are formed in the device wafer.

An advantageous embodiment of the invention provides that an optoelectronic component be arranged on the cover surface of the carrier substrate as the component. The optoelectronic component can be a light-emitting or light-receiving component. For example, a light-emitting component is a light-emitting diode, whether it be an organic or inorganic embodiment. One example for a light-sensitive component is a photocell, which can also be present in an organic or inorganic design.

A further development of the invention preferably provides that the arrangement be fabricated accordingly to the SMD technology (SMD—"surface mounted device"). In one embodiment, this means in particular that the capsulated components may be furtherly processed with conventional, so-called "pick-and-place" technologies, soldering pastes or the like. When using this technology or other technologies, the carrier substrate can consist of at least one material selected from the following group of materials: Semiconductors, such as silicon, ceramic, glass, metal substrate, and plastic, such as printed circuit board or flex substrate, which are preferably furnished with the corresponding printed conductor structures and/or through contacts (vias). In a special case, the carrier substrate can be the device wafer itself. As an alternative to a wafer level process, it can be provided that pre-singulated caps be directly adhesively bonded to a printed circuit board. Pre-singulated caps can also be adhesively bonded directly to a singulated chip. The cover substrate can consist of glass, for example borosilicate glass, quartz glass, sapphire glass, silicon, ceramic, metal or plastic.

An advantageous embodiment of the invention can provide that at least sections of the rear side of the cover substrate be furnished with a substrate coating, at least in areas not covered by the spacer elements. The substrate coating on the rear side can also be designated as an inner coating. Alternatively or additionally, a coating can be formed on the front side of the cover substrate, and also be referred to as an outer coating. The coating can be composed of one or more layers. The substrate coating on the front and/or rear side of the cover substrate can be designed as a structured coating, i.e., a non-continuous or partially interrupted coating, or as a plane continuous coating. If the component in the hollow space is an optoelectronic component, the coating can be generated and used to influence light passing through the cover substrate, whether it be out of the hollow space or into the latter, for example through absorption and/or light conversion. For example, an embodiment can provide that phosphorescent materials ("phosphorus") be integrated into the coating on the front and/or rear side, which absorb light of one or more wavelengths, and then emit light of one or more other wavelengths again. In one configuration, the rear coating is fabricated as a so-called phosphorus layer. A phosphorescent material can be incorporated into the cap for conversion to white light if used as a cap for an LED application (LED—light-emitting diode). This is made possible by introducing silicones or epoxies that are mixed with the phosphorescent material into the cap after joining the spacer element and cover substrate. After the bonding agent has hardened, this semi-finished product is subsequently bonded to the component carrier via an adhesive bond. The phosphorescent material can also be introduced into a photoresist, photolithographically structured and applied to the cover substrate. The spacer element and cover substrate as well as the semi-finished product and component carrier are then also joined by way of adhesive bonds.

Phosphorescent materials can also be incorporated into an adhesive and applied to the cover substrate via spin coating. The adhesive layer then serves as a phosphorescent material matrix on the one hand, and as an adhesive layer for joining the structured spacer element and cover substrate on the other. As an alternative, phosphorescent materials can be embedded into the adhesive layer of a foil, which is laminated onto the cover substrate. So-called sol-gel methods can also be used to apply the phosphorescent material onto the cover substrate. To this end, the phosphorescent materials are incorporated in mixtures of corresponding sol-gel educts. After a corresponding temperature treatment, a vitreous layer containing phosphorescent materials forms. For example, document WO 2008/058619 A1 discloses a selection of phosphorescent materials.

Dielectric coatings are preferably fabricated on the front and/or rear side of the cover substrate as an evaporation deposited layer, for which purpose use is made of plasma-enhanced thermal evaporation, in particular plasma-enhanced electron beam evaporation. However, other layer deposition processes can also be used, depending on the application. The coating can be formed on the front and/or rear side of the cover substrate before or after fabricating the structured spacer elements on the rear side of the cover substrate. In one embodiment, the coating can be used to generate a partially antireflective or partially reflective surface.

The coatings on the front and/or rear side of the cover substrate can be configured as a metal layer, which has a structured or unstructured design. For example, a structured metal layer can serve to optically shadow specific regions on the component chip, or sit directly in the active beam path as an aperture.

In one embodiment, the coating on the front and/or rear side can also perform optical functions other than that of an antireflection layer. Arrangements can be made to create an optically diffractive element, a filter or an absorber layer.

In optical applications, there is a special advantage to integrating lenses in a convex, concave or diffractive structural configuration on the front and/or rear side of the cover substrate. Lenses can be realized on the glass cover substrate through the application of corresponding photoresist structures. For example, radial photoresist structures can be structured, after which the structures can be remelted into photoresist lenses. The lens structures can be incorporated into the glass via reactive ion etching. Lenses can also be fabricated directly in polymers via moulding/replication with corresponding master tools, or through ion exchange.

A multiple lens component can thusly be constructed by connecting several spacer elements, for example which are joined with the cover substrate provided with lenses. For example, a stack of elements with several cover substrates and several spacer elements would be created in this way, wherein the cover substrates are spaced apart via the spacer elements.

In an expedient embodiment, the spacer elements are fabricated with a height of about 10 μm to about 300 μm, preferably with a height of about 30 μm to about 300 μm, and more preferably with a height of about 30 μm to about 100 μm.

In a preferred embodiment of the invention, the spacer elements are manufactured out of a material selected from the following group of materials: glass, ceramic and plastic. Involved here are materials used as an alternative to a semiconductor material, in particular silicon.

The explanations given in conjunction with accompanying embodiments of the method apply accordingly with respect to advantageous configurations of the arrangement.

In a different embodiment, the spacer element can as an option be bonded onto the carrier preassembled with the components, and then opened via back thinning. The cover substrate is then assembled in the last procedural step. In this embodiment, one or more cavities are first introduced into the substrate for the spacers. The substrate is then bonded onto the preassembled carrier, so that the components become situated in the cavities. The cavities are opened via back thinning, so as to finally apply the cover substrate. It can alternatively be provided that the components be introduced after the opening process, meaning that they not be already preassembled.

In conjunction with the method for manufacturing a semi-finished product for a component arrangement with a capsulated component as well as the semi-finished product for a component arrangement, the explanations provided above concerning advantageous configurations apply accordingly, for example with respect to the configuration of the spacer elements with or without slanted lateral surfaces.

BRIEF DESCRIPTION OF THE DRAWINGS

The invention will be described in greater detail below based on preferred exemplary embodiments, with reference to the figures of a drawing. Shown on:

FIG. 1 shows a diagrammatic view for explaining a method involving several steps a) to d) for creating spacer elements 1 in a structured form on a rear side 2 of a cover substrate 3. In a step a) according to FIG. 1, cavities or pits 5 are first introduced into a substrate 4, e.g., a semiconductor wafer, for example via etching. A silicon substrate is machined for this purpose in one embodiment. In the exemplary embodiment shown, slanted lateral surfaces 6 of the recesses 5 are in step b) then at least partially furnished with a metal coating 7, for example made out of aluminum or silver. The cover substrate 3, e.g., an unstructured glass wafer, is subsequently applied to a cover surface 8 of the substrate in step c) according to FIG. 1. For example, the cover substrate 3 is attached via bonding. The substrate 4 is thinned back in the ensuing step d) according to FIG. 1, in particular via etching and/or machining, thereby opening recesses 9 bordered by the spacer elements 1.

Figure 1:
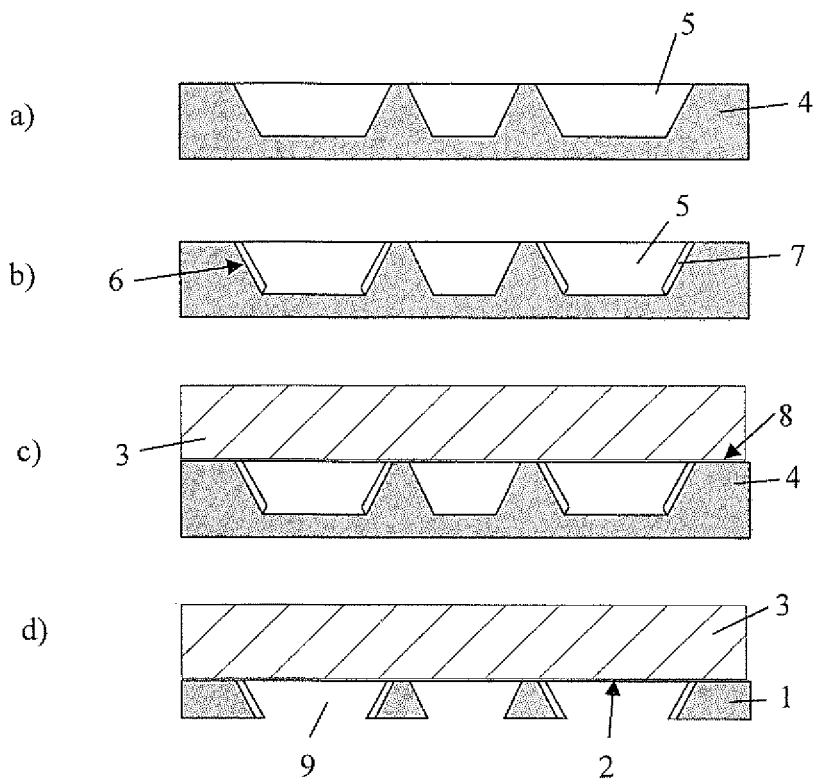
FIG. 1 is a diagrammatic view for explaining several procedural steps involved in manufacturing spacer elements.
Figure 2:
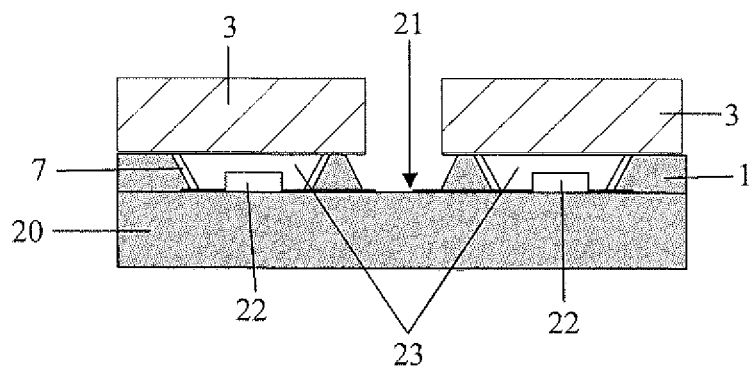
FIG. 2 is a diagrammatic view of an arrangement in which the components are each arranged in a hollow space on a carrier substrate.

According to FIG. 2, the arrangement from FIG. 1 manufactured in this way is then applied with the spacer elements 1 arranged on the rear side of the cover substrate 3 onto a carrier substrate 20, specifically onto a cover surface 21 of the carrier substrate 20, where components 22 are already located. In this way, the components 22 are arranged and capsulated in hollow spaces 23.

For example, the arrangement according to FIG. 2 can involve a so-called opto-package, in which the components 22 are designed as optoelectronic components, which emit or receive light. In one configuration, the metal coating 7 here serves as a kind of optical reflective or antireflective surface. The lateral walls of the structured spacer elements 1 are slanted between the carrier substrate 20 and cover substrate 3.

Figure 3:
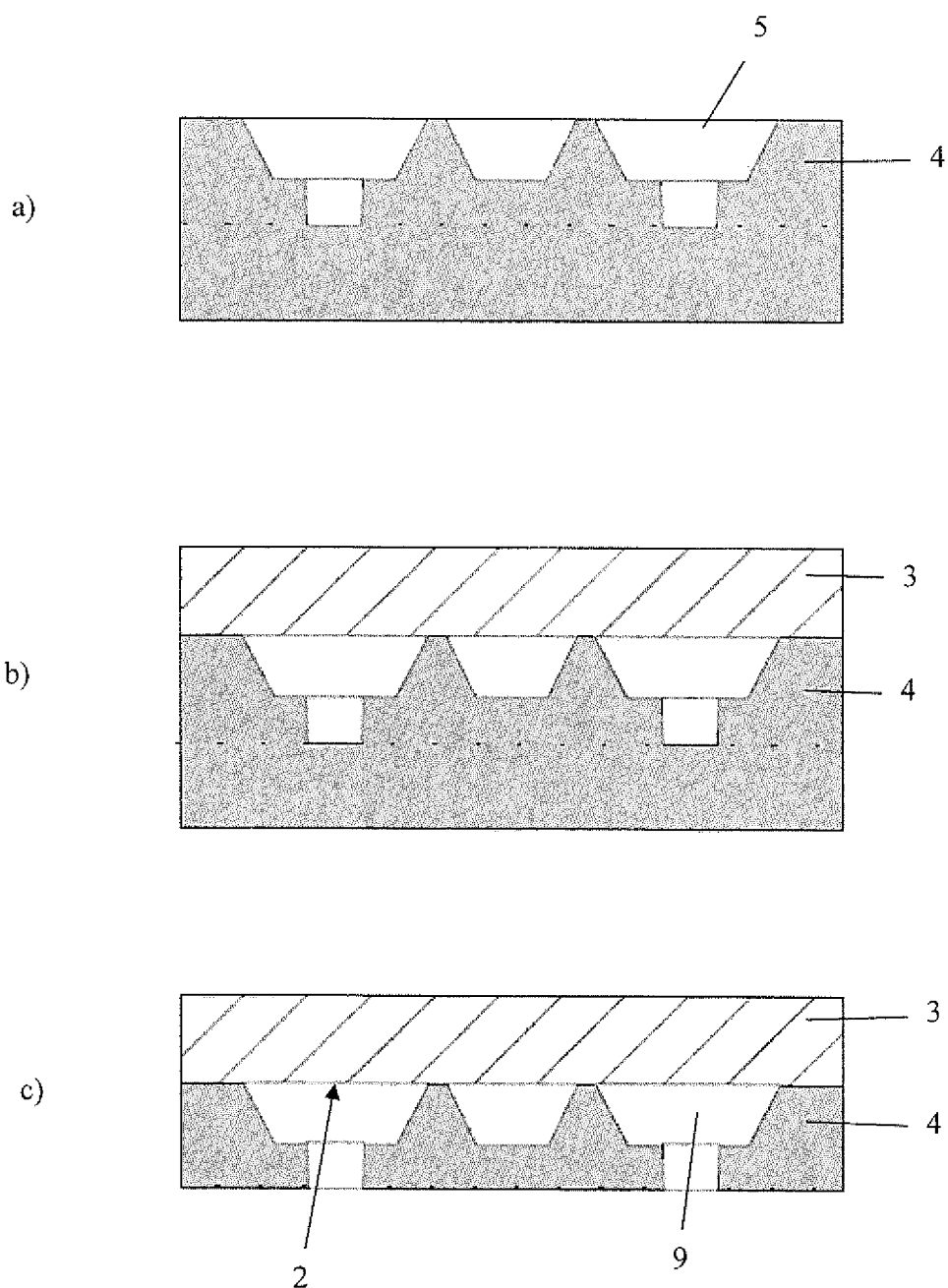
FIG. 3 is a diagrammatic view for explaining several procedural steps involved in manufacturing spacer elements according to another embodiment, in which cavities are fabricated in differing configurations.

Comparably to FIG. 1, FIG. 3 shows a multistage process for manufacturing spacer elements 1 in a structured form on the rear side 2 of a cover substrate 3. As opposed to the embodiment according to FIG. 1, the recesses or pits 5 are fabricated in the substrate 4 in multiple stages during step a). After the first recesses 5a have been manufactured, additional recesses 5b are introduced in the existing recesses 5a in an ensuing step. Recesses or cavities 5 varying in configuration are generated in this way. Additional steps b) and c) correspond to steps c) and d) on FIG. 1, and involve then applying the cover substrate 3 and thinning back the substrate 4 until the hollow spaces formed by the recesses 5 are open on the side facing away from the cover substrate 3.

Figure 4:
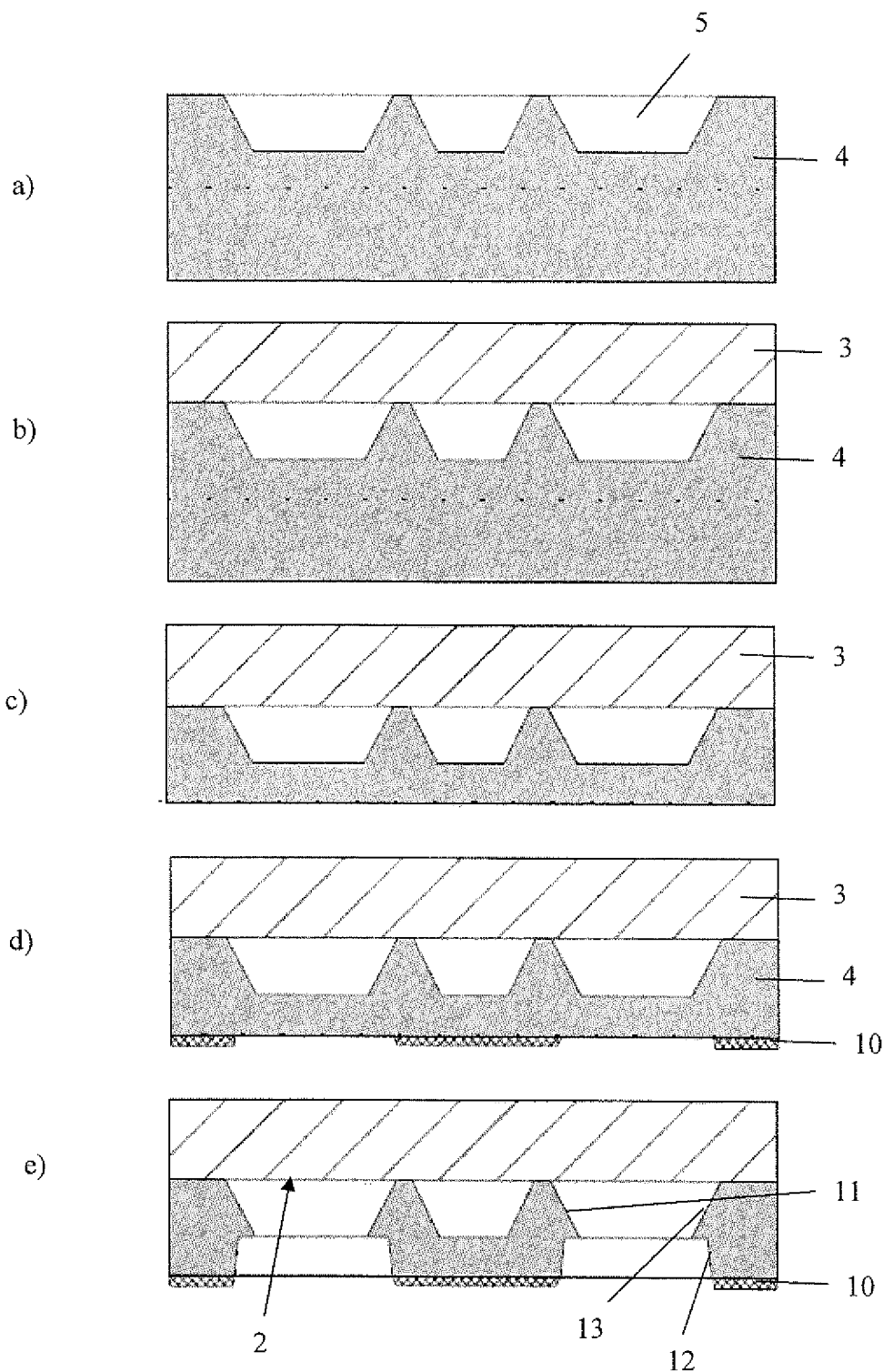
FIG. 4 is a diagrammatic view for explaining several procedural steps involved in manufacturing spacer elements according to a further embodiment, in which back thinning is performed by means of a masking technology.

FIG. 4 shows a diagrammatic view for explaining several procedural steps involved in manufacturing spacer elements 1 on the rear side 2 of the cover substrate 3 in another embodiment. The steps a) and b) depicted on FIG. 4 then correspond to steps a) and c) on FIG. 1. As opposed to the embodiment on FIG. 1, back thinning now occurs in multiple stages on FIG. 4, wherein back thinning takes place in step c) over the entire depicted surface of the substrate 4. A mask 10 (shadow mask technology) is subsequently applied in step d), so as to further thin back the surfaces of the substrate 4 not covered by the mask 10 in step e), until the recesses 5 on the side facing away from the cover substrate 3 are open.

Back thinning is simultaneously accompanied by a further structuring of lateral surfaces 11, which are further configured in terms of their contour. While a lower section 12 of the lateral surface 11 sooner tends to run vertically, the upper section 13 of the lateral surface 11 formed next to the cover substrate 4 is slanted in design. It can be provided that the lower section 12 and upper section 13 of the lateral surface 11 be furnished with different coatings and/or surface structures. For example, the upper section 13 has a coating, which is used to fabricate a color filter, a reflector, an absorber, a diffuser, a lens, a lattice, a conductor path or a bond surface. The lower section 12 selected from this group can be entirely or partially coated in a different manner.

Additional embodiments will be described below drawing reference to FIGS. 5 to 9. The same reference numbers as on FIGS. 1 to 4 will here be used for the same features.

Figure 5:
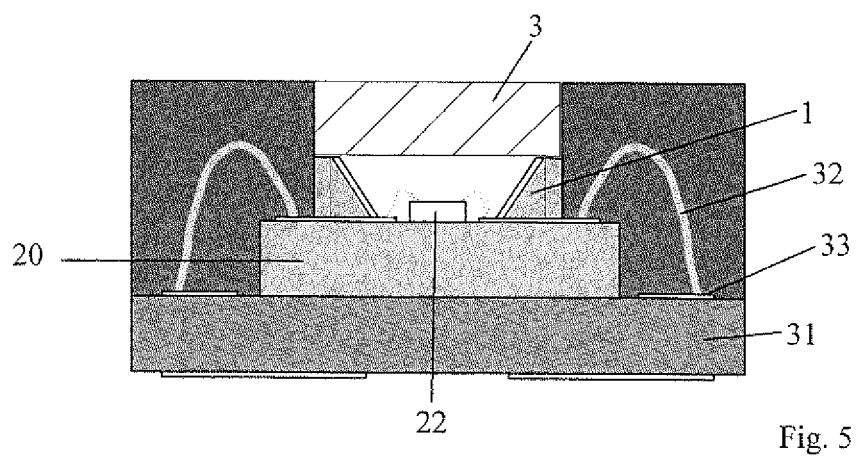
FIG. 5 is a diagrammatic view of an arrangement in which a component is arranged on a carrier substrate in a hollow space, wherein spacer elements exhibit slanted lateral surfaces in the hollow space region.

FIG. 5 shows a diagrammatic view of an arrangement in which, comparably to the arrangement on FIG. 2, a component 22 is situated in the hollow space 23, which is formed with slanted lateral walls. The carrier substrate 20 is applied to an additional substrate 31. Electrical contacts 32 connect the component 22 with connectors 33.

Figure 6:
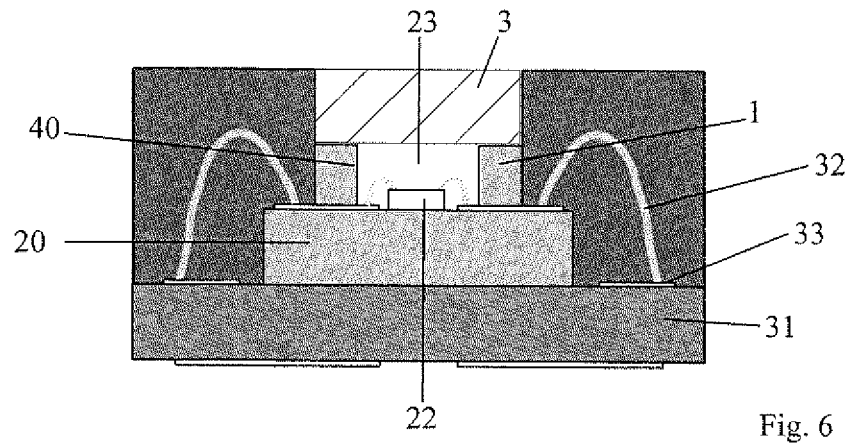
FIG. 6 is a diagrammatic view of an arrangement in which a component is arranged on a carrier substrate in a hollow space, wherein spacer elements exhibit parallel lateral walls.

FIG. 6 shows a diagrammatic view of an arrangement in which the spacer elements 1 are formed with parallel lateral surfaces or walls 40, in particular also on the inner surface facing the hollow space 23. For example, the straight lateral walls 40 of the spacer elements 1 can be realized by means of dry etching methods, e.g., in a Bosch process when using Si. Apart from that, the configuration of the arrangement on FIG. 6 is comparable to the embodiment on FIG. 5.

Figure 7:
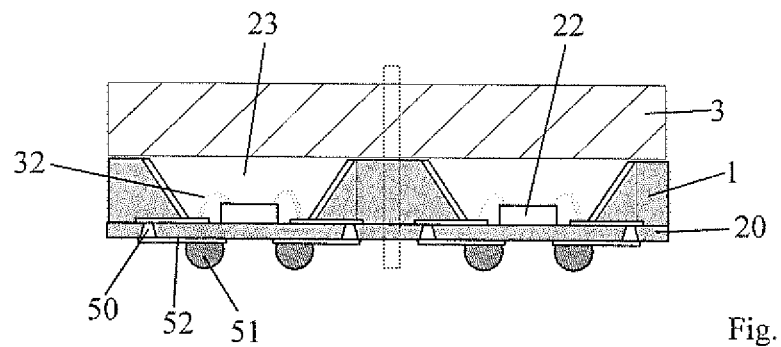
FIG. 7 is a diagrammatic view of an arrangement in which components arranged on a carrier substrate and in a hollow space are connected with rear-side contacts on the carrier substrate by means of through contacts through the carrier substrate.
Figure 8:
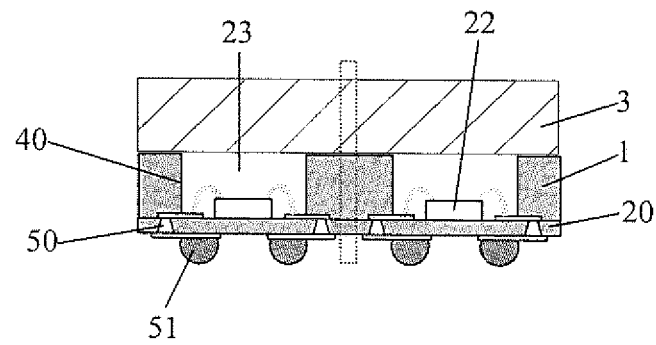
FIG. 8 is a diagrammatic view of a further arrangement in which components arranged on a carrier substrate and in a hollow space are connected with rear-side contacts on the carrier substrate just as on FIG. 7, wherein spacer elements exhibit parallel lateral walls.

FIG. 7 shows a diagrammatic view of an arrangement in which two components 22 are situated in adjacent hollow spaces 23, wherein through contacts 50 connect the components 22 with rear-side soldering contacts 51. The rear-side soldering contacts 51 are connected with the through contacts 50 by conductor lines (redistribution) 52, which has a fan-in or fan-out configuration. The embodiment on FIG. 5 corresponds to the so-called SMD technology (SMD—"service mounted device"). SMD technology enables a direct assembly of the component, for example on a printed circuit board. For example, contacting takes place by way of a soldering contact or an electrically conductive adhesive. The arrangement on FIG. 7 can also be manufactured with structured spacer elements exhibiting parallel lateral walls 40, as shown on FIG. 8.

Figure 9:
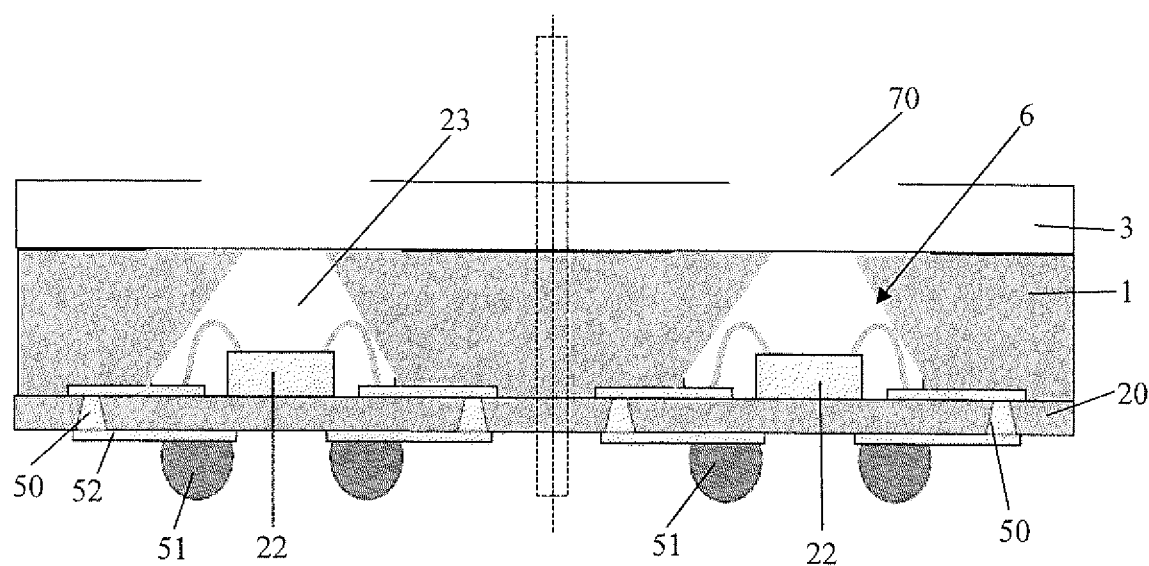
FIG. 9 is a diagrammatic view of a further arrangement in which components arranged on a carrier substrate and in a hollow space are connected with rear-side contacts on the carrier substrate just as on FIG. 7, wherein the slanted lateral walls of spacer elements are designed with an opposite inclination by comparison to FIG. 7.

FIG. 9 shows a diagrammatic view of another arrangement, in which, just as on FIG. 7, components 22 situated on a carrier substrate and in a hollow space 23 are connected by through contacts 50 with rear-side soldering contacts 51 on the carrier substrate 20. As opposed to FIG. 7, the slanted lateral walls 6 exhibit an opposing inclination on the inside. The surface of the cover substrate 3 is provided with micro-structured lenses 70. In one embodiment, the slanted lateral surfaces 6 of the spacer element 1 are roughened beforehand, for example via plasma pretreatment or sandblasting. With respect to the structural design of the lenses/apertures, the advantage here is that scattered light can be prevented from exerting a disruptive influence in the cap.

As a departure from the method described above, another manufacturing process can also be used in this embodiment. For example, a silicon spacer element 1 fabricated via KOH etching is first adhesively bonded onto the component carrier. This is followed by joining with the cover substrate 3. The narrow opening in the spacer elements 1 then abuts the cover substrate 3, and creates an optical aperture.

As an alternative, it is also possible to fabricate a semi-finished product consisting of one or more completely structured spacer elements with inclines on a cover substrate, which is subsequently connected with a carrier arranged with components. In this type of manufacturing process, the one or several spacer elements are generated without a procedural step for back thinning.

The features of the invention disclosed in the above specification, claims and drawing can be important both individually and in any combination desired for realizing the invention in its various embodiments.

The invention claimed is:

1. An arrangement, comprising:
   a carrier substrate; and
   a component situated on a cover surface of the carrier substrate in a hollow space, and electrical contacts for the component,
   wherein the hollow space is comprised of a plurality of spacer elements arranged on the cover surface of the carrier substrate and a cover substrate mounted on the plurality of spacer elements;
   wherein the plurality of spacer elements are made of a semiconductor material and comprise an optically reflective metal coating, the plurality of spacer elements each being formed with a contour facing the hollow space, the contour comprising an inclined surface section, further wherein the optically reflective metal coating completely or partially covers the inclined surface section of the spacer elements facing the hollow space;
   wherein a through contact connects the component with a rear-side soldering contact, the rear-side soldering contact being connected to the through contact by a conductor line, which has at least one of a fan-in configuration and a fan-out configuration, further wherein the conductor line runs along a rear surface of the carrier substrate.

2. The arrangement according to claim 1, wherein at least sections of a front side and/or a rear side of the cover substrate are furnished with a substrate coating, at least in areas not covered by the plurality of spacer elements.

3. The arrangement according to claim 1, wherein the plurality of spacer elements have a height of about 10 μm to about 300 μm.

4. The arrangement according to claim 1, wherein the component is an optoelectronic component.

5. The arrangement according to claim 4, wherein the component is a light-emitting diode or a photocell.

6. The arrangement according to claim 1, wherein the plurality of spacer elements have a height about 30 μm to about 300 μm.

7. The arrangement according to claim 1, wherein the plurality of spacer elements have a height about 30 μm to about 100 μm.

8. The arrangement of claim 1, wherein the metal coating is made of aluminum.

9. The arrangement of claim 1, wherein the metal coating is made of silver.

10. The arrangement of claim 1, wherein the spacer elements comprise a further metal coating which is arranged adjacent to the carrier substrate.

11. A semi-finished product comprising a carrier substrate made of silicon, wherein one or more recesses are formed into one side of the carrier substrate, and wherein the semi-finished product further comprises an alkaline glass directly applied to the side of the carrier substrate having the one or more recesses;
   wherein a component is situated on a cover surface of the carrier substrate in a hollow space, and a plurality of spacer elements each formed with a contour facing the hollow space, the contour comprising an inclined surface section, further wherein an optically reflective metal coating completely or partially covers the inclined surface section of the spacer elements facing the hollow space.

12. The semi-finished product of claim 11, wherein the semi-finished product is suitable for producing an arrangement with an electronic component.

13. The semi-finished product according to claim 11, wherein the alkaline glass is provided as a structured layer.

14. The semi-finished product according to claim 11, wherein the alkaline glass provides an anodic bond for a cover substrate.

15. A semi-finished product comprising:
a cover substrate;
a plurality of spacer elements formed on a rear side of the cover substrate; and
a receiving hollow space formed between the spacer elements,
wherein the receiving hollow space is configured for the reception of a component;
wherein the plurality of spacer elements are made of a semiconductor material and comprise an optically reflective metal coating, the plurality of spacer elements each being formed with a contour facing the hollow space, the contour comprising an inclined surface section, further wherein the optically reflective metal coating completely or partially covers the inclined surface section of the spacer elements facing the hollow space;
wherein a through contact connects the component with a rear-side soldering contact, the rear-side soldering contact being connected to the through contact by a conductor line, which has at least one of a fan-in configuration and a fan-out configuration, further wherein the conductor line runs along a rear surface of a carrier substrate.

16. The semi-finished product according to claim 15, wherein the plurality of spacer elements have a height of about 10 μm to about 300 μm.

17. The semi-finished product according to claim 15, wherein the semi-finished product is formed in wafer-level.

18. The semi-finished product according to claim 15, wherein at least sections of a front side and/or a rear side of the cover substrate are furnished with a substrate coating, at least in areas not covered by the plurality of spacer elements.

19. The semi-finished product according to claim 15, wherein the plurality of spacer elements have a height of about 30 μm to about 100 μm.

20. The semi-finished product of claim 15, wherein the metal coating is made of aluminum.

21. The semi-finished product of claim 15, wherein the metal coating is made of silver.

* * * * *